(12) United States Patent
Ogihara et al.

(10) Patent No.: US 9,214,597 B2
(45) Date of Patent: Dec. 15, 2015

(54) SEMICONDUCTOR DEVICE

(71) Applicant: Oki Data Corporation, Tokyo (JP)

(72) Inventors: Mitsuhiko Ogihara, Takasaki (JP);
Tomohiko Sagimori, Takasaki (JP);
Takahito Suzuki, Takasaki (JP);
Masataka Muto, Takasaki (JP)

(73) Assignee: Oki Data Corporation, Tokyo (JP)

( * ) Notice: Subject to any disclaimer, the term of this patent is extended or adjusted under 35 U.S.C. 154(b) by 16 days.

(21) Appl. No.: 13/911,133

(22) Filed: Jun. 6, 2013

(65) Prior Publication Data

US 2013/0264605 A1 Oct. 10, 2013

Related U.S. Application Data

(63) Continuation of application No. 12/730,826, filed on Mar. 24, 2010, now Pat. No. 8,481,342.

(30) Foreign Application Priority Data

Mar. 31, 2009 (JP) .................................. 2009-084099

(51) Int. Cl.
| | |
|---|---|
| H01L 33/00 | (2010.01) |
| H01L 33/02 | (2010.01) |
| H01L 25/16 | (2006.01) |
| H01L 29/04 | (2006.01) |
| H01L 25/04 | (2014.01) |
| H01L 25/075 | (2006.01) |
| H01L 33/60 | (2010.01) |
| H01L 33/62 | (2010.01) |

(52) U.S. Cl.
CPC .............. *H01L 33/02* (2013.01); *H01L 25/167* (2013.01); *H01L 29/045* (2013.01); *H01L 25/046* (2013.01); *H01L 25/0753* (2013.01); *H01L 33/0079* (2013.01); *H01L 33/60* (2013.01); *H01L 33/62* (2013.01); *H01L 2224/48091* (2013.01); *H01L 2924/09701* (2013.01); *H01L 2924/10253* (2013.01)

(58) Field of Classification Search
None
See application file for complete search history.

(56) References Cited

U.S. PATENT DOCUMENTS

| | | | | |
|---|---|---|---|---|
| 5,909,052 | A * | 6/1999 | Ohta et al. ................ | 257/627 |
| 6,366,468 | B1 * | 4/2002 | Pan ........................... | 361/761 |
| 6,533,391 | B1 * | 3/2003 | Pan ........................... | 347/42 |
| 8,022,436 | B2 * | 9/2011 | Takeuchi et al. ........... | 257/99 |
| 2006/0097354 | A1 | 5/2006 | Ogihara et al. ............. | 257/613 |
| 2007/0032089 | A1 * | 2/2007 | Nuzzo et al. ................ | 438/725 |
| 2007/0080372 | A1 | 4/2007 | Faure et al. ................. | 257/201 |
| 2008/0194084 | A1 * | 8/2008 | Kononchuk et al. ........ | 438/488 |
| 2009/0315965 | A1 * | 12/2009 | Yamagata et al. .......... | 347/130 |
| 2010/0026779 | A1 * | 2/2010 | Yonehara et al. ........... | 347/238 |
| 2010/0123161 | A1 * | 5/2010 | Takeuchi et al. ............ | 257/99 |
| 2013/0264605 | A1 * | 10/2013 | Ogihara et al. ............. | 257/99 |

FOREIGN PATENT DOCUMENTS

| | | |
|---|---|---|
| JP | 2002-232021 A | 8/2002 |
| WO | 2006/130721 A2 | 12/2006 |

\* cited by examiner

*Primary Examiner* — David E Graybill
(74) *Attorney, Agent, or Firm* — Marvin A. Motsenbocker; MOTS Law, PLLC

(57) ABSTRACT

A method for manufacturing a semiconductor device, includes: a step of etching a Si (111) substrate along a (111) plane of the Si (111) substrate to separate a Si (111) thin-film device having a separated surface along the (111) plane.

15 Claims, 15 Drawing Sheets

SEMICONDUCTOR DEVICE

CROSS REFERENCE TO RELATED APPLICATIONS

This application is a continuing application of application Ser. No. 12/730,826, filed on Mar. 24, 2010, which is based upon and claims the benefit of priority from the prior Japanese Patent Application No. 2009-084099, filed on Mar. 31, 2009, the entire contents of which is incorporated herein by reference.

BACKGROUND OF INVENTION

1. Field of the Invention

The invention relates to a method for manufacturing a semiconductor device, a semiconductor device, and a semiconductor composite device, which make it possible, by a low-cost simple process, to obtain a high quality circuit/device forming region having a flat separated surface from a Si substrate.

2. Description of Related Art

Conventionally, a SOI (Silicon on Insulator) substrate has been manufactured by: implanting hydrogen ions in a depth direction from a surface of a first single crystal Si substrate to form a hydrogen ion implanted layer (hydrogen added layer) at a predetermined depth; bonding the surface of the first single crystal Si substrate to a second single crystal Si substrate having an $SiO_2$ layer; and then separating at a part on the Si substrate side of the hydrogen added layer in the first single crystal Si substrate.

In addition, for example, regarding a method for transferring a single crystal Si thin-film device layer, a technique using the method for separation at a hydrogen added layer is disclosed in Japanese Patent Application Publication No. 2005-26472 (hereinafter referred to as Patent Document 1). The technique disclosed in Patent Document 1 is a technique in which: a hydrogen ion implanted layer is formed at a predetermined depth in a depth direction from a surface of a single crystal Si substrate (first substrate) with a single crystal Si thin-film device formed thereon; the single crystal Si thin-film device forming the surface of the single crystal Si substrate (first substrate) is bonded to a surface of an insulating substrate (second substrate); and then the single crystal Si substrate (first substrate) is separated at the hydrogen added layer in which hydrogen ions are implanted.

SUMMARY OF THE INVENTION

However, in the method for separating the single crystal Si substrate of Patent Document 1, the implantation of hydrogen ions may cause a defect in the single crystal Si thin-film device layer which is formed on the single crystal Si substrate. In addition, the separated surface resulting from separation at the hydrogen added layer is badly damaged and is markedly uneven due to the implantation of the hydrogen ions. For these reasons, the method requires the additional steps of removing the damaged surface as well as smoothing the remarkably uneven separated surface. Moreover, the method has a problem in the manufacturing process, that is, the strict bonding conditions, such as the requirement of a heavier load for bonding and the requirement of a high temperature for bonding, in order to bond thick substrates to each other.

Furthermore, this method also has a problem of reliability. Specifically, after the single crystal Si thin film is formed, hydrogen ions for the separation are implanted, and high temperature processing is performed, which is required for the step of bonding the substrates to each other. This causes deterioration of the device characteristics. Furthermore, this method has a problem of manufacturing cost. Specifically, adding manufacturing steps including hydrogen ion implantation and wafer bonding under strict conditions leads to higher manufacturing costs.

A first aspect of the invention is a method for manufacturing a semiconductor device, including: etching a Si (111) substrate along a (111) plane of the Si (111) substrate to separate a Si (111) thin-film device having a separated surface along the (111) plane.

A second aspect of the invention is a semiconductor device including: a substrate having a surface; and a single crystal Si (111) thin-film device having a first surface forming a circuit/device forming region and a second surface opposed to the first surface. The second surface of the single crystal Si (111) thin-film device is directly contacted with and thus fixed on the surface of the substrate.

A third aspect of the invention is a semiconductor composite device including: a substrate having a surface; a single crystal Si (111) thin-film device having a first surface including a circuit/device forming region and a second surface opposed to the first surface; a single crystal thin-film light emitting device having an electrode forming surface and a bonding surface provided on an opposite side to the electrode forming surface. The second surface of the single crystal Si (111) thin-film device is directly contacted with and is thus fixed on the surface of the substrate. The bonding surface of the single crystal thin-film light emitting device is directly and closely contacted with, and is fixed on, the surface of the substrate. The single crystal Si (111) thin-film device and the single crystal thin-film light emitting device are connected by metal wiring.

According to the aspects of the invention, a high quality circuit/device forming region having a flat separated surface can be obtained from the Si substrate.

DETAILED DESCRIPTION OF EMBODIMENTS

Concerning the semiconductor device, the semiconductor composite device, and the method for manufacturing the semiconductor device, first to fourth embodiments of the invention are described with reference to FIG. 1 to FIG. 14.

First Embodiment

A first embodiment of the invention is described with reference to FIG. 1 to FIG. 5.

Figure 1A:
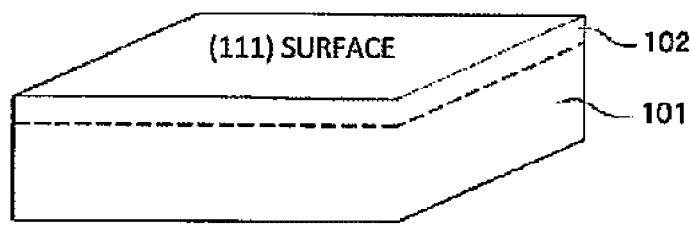
FIG. 1A and FIG. 1B are perspective views illustrating a first substrate configuration and a step of manufacturing isolated islands in a first embodiment of the invention.
Figure 1B:
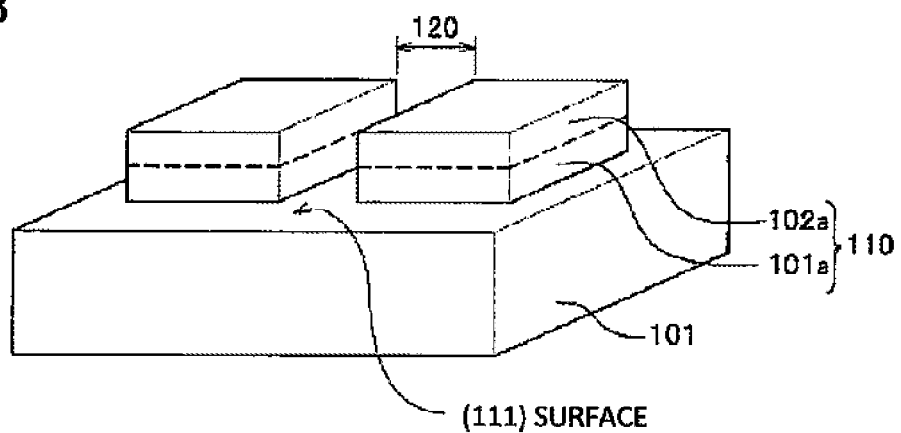

FIG. 1A is a perspective view showing a configuration of Si (111) substrate 101, which is a first substrate, and circuit/device forming region 102 on the surface of Si (111) substrate 101. FIG. 1B is a perspective view showing a step of forming isolated islands 110 by forming an isolation region 120 in a depth direction from the surface of Si (111) substrate 101 of the first substrate. Each of the isolated islands 110 includes isolated circuit/device forming region 102a and isolated substrate region 101a which are part of Si (111) substrate 101 of the first substrate.

In FIG. 1A, circuit/device forming region 102 is a region in which an integrated circuit including junctions, capacitors, resistors and the like, and a circuit/device such as a single device, a composite devices or the like is formed in Si (111) substrate 101 of the first substrate. The thickness of circuit/device forming region 102 depends on the circuit or device being formed. For example, an integrated circuit using a CMOS transistor has a thickness of about 10 µm. Herein, the thickness of circuit/device forming region 102 represents a thickness including a thickness which forms a circuit/device and a thickness necessary for the circuit or device to effectively perform predetermined characteristics.

A crystal plane in the principal surface of the surface of Si (111) substrate 101 is oriented in the (111) plane as indicated by the Miller index. There is included a case in which the crystal orientation of the principal surface of the Si substrate is inclined from the strict (111) plane (hereinafter referred to as a (111) just plane).

As shown in FIG. 1B, isolated islands 110 are formed to have a predetermined size (region) by etching and isolating parts of Si (111) substrate 101 of the first substrate where predetermined circuits, devices and the like are formed in the predetermined sizes. When isolated islands 110 are formed, etching is used to form isolated islands 110 each having a depth including at least circuit/device forming region 102a and isolated substrate region 101a. For the etching of isolation region 120 for forming each of isolated islands 110, any method of dry etching and wet etching or a combination thereof can be used, depending on the width of isolation region 120 or the desired shape of the side of isolated island 110. Herein, in a region other than isolated island 110 of Si (111) substrate 101 of the first substrate having the (111) plane, a surface thereof after etching isolation region 120 is exposed.

Figure 2A:
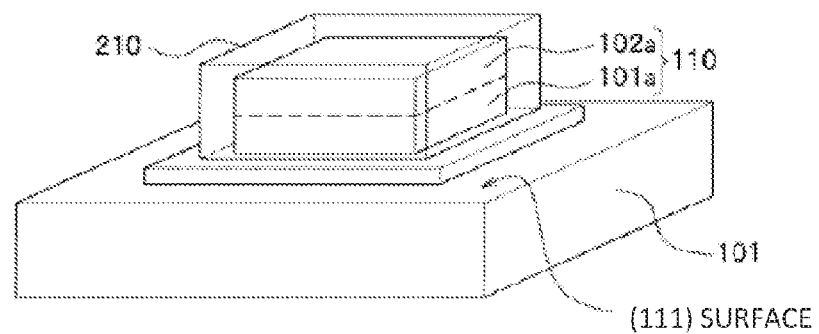
FIG. 2A to FIG. 2C are views illustrating manufacturing steps in the first embodiment of forming a coating layer and separating a single crystal Si (111) thin-film device from the first substrate.
Figure 2B:
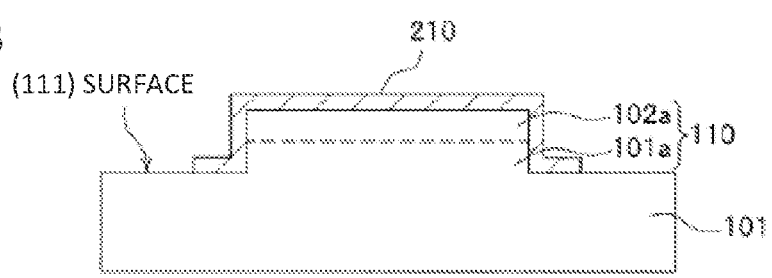
Figure 2C:
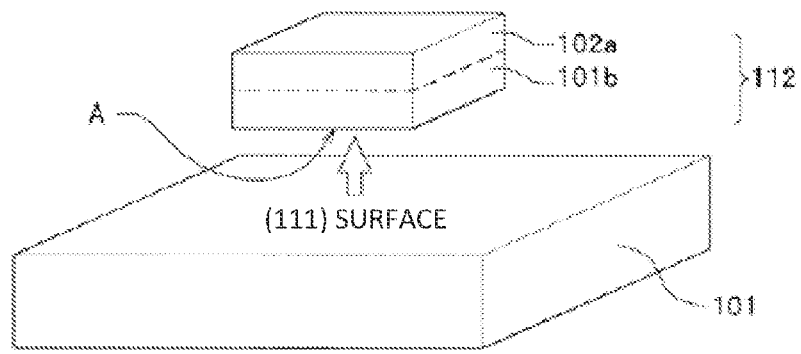

Next, a step of separating isolated island 110 from Si (111) substrate 101 of the first substrate is described with reference to FIG. 2A to FIG. 2C, isolated island 110 including isolated circuit/device region 102a and isolated substrate region 101a. First, as shown in FIG. 2A and FIG. 2B, coating layer 210 that coats at least a part or all of the side surfaces of isolated island 110 is formed. In FIG. 2A and FIG. 2B, coating layer 210 coats all of the side surfaces of isolated island 110, and partially coats a region of the bottom of isolation region 120. However, this configuration is just an example, and an opening may be formed in part of the side surfaces of isolation region 120 or an opening may be provided on part of coating layer 210. Furthermore, it is also possible to form coating layer 210 only on in part or all of the side surfaces of isolated island 110. Additionally, a configuration of coating layer 210 can be changed, as appropriate, depending on the design.

Coating layer 210 can be formed of an insulating film. It is preferable that coating layer 210 is sufficiently resistant to an etchant for etching Si (111) substrate 101 of the first substrate in order to separate isolated island 110, to be described later, from Si (111) substrate 101 of the first substrate. Coating layer 210 may be made of one or more types of material selected from SiN film, $SiO_2$ film, SiON film, $Al_2O_3$ film, AlN film, PSG film, and BSG film. The film can be formed by selecting a film formation method such as a P-CVD method, a CVD method, a sputtering method or the like, as appropriate. In addition, the film may be formed by an application method such as a spin on glass (SOG) or the like or other printing method. Furthermore, coating layer 210 may contain a film made of an organic material in addition to an inorganic material. When coating layer 210 contains an organic material film, the surface thereof can be further coated with the inorganic insulating film material so that coating layer 210 can be resistant to the etchant for Si (111) substrate 101 of the first substrate to be described later.

The point of this embodiment is that Si (111) substrate 101 of the first substrate having isolated island 110 coated with coating layer 210 is selectively etched in a lateral direction of the substrate along the (111) plane in a lower region of isolated island 110 or a region including a part of substrate region 101a of isolated island 110. In addition, prior to the step of soaking the Si (111) substrate of the first substrate in the etchant, a first support of isolated island 110 and a second support connecting each isolated island 110 or the like can be provided.

Herein, selective etching in a lateral direction of the substrate along the (111) plane means that the etchant etches the Si substrate in a direction perpendicular to the (111) plane at a lower etching rate than in the lateral direction along the (111) plane. Strictly speaking, etching in the direction perpendicular to the (111) plane (etching in a vertical direction) also proceeds together as etching progresses along the (111) plane (progress of etching in a horizontal direction), although the etching rate in the vertical direction is lower than the etching rate in the lateral direction. Accordingly, the thickness of a single crystal Si (111) thin film, separated shown in FIG. 2C, is thinner than that of isolated island 110 of FIG. 1B by a thickness reduced by etching of a part of substrate region 101a (partial thin layer) of isolated island 110 shown in FIG. 2B.

Therefore, for the etchant, it is preferable to use an anisotropic etchant capable of selective etching in a lateral direction of the substrate along the Si (111) plane. Herein, anisotropy of etching of the Si (111) substrate of the first substrate means etching in which the etching rate differs depending on the orientation of a crystal face of Si. In the embodiment, as an anisotropic etchant of Si, an etchant containing a chemical selected from KOH or tetra-methyl-ammonium-hydroxide (TMAH) is preferable. In addition, although not preferable, ethylene diamine pyrocatechol (EDP) can be used as the anisotropic etchant for Si.

In the embodiment, isolated island 110, on which coating layer 210 is provided, is separated from Si (111) substrate 101 of the first substrate by the anisotropic etching along the Si (111) plane. Isolated island 110, including circuit/device forming region 102a separated from the Si (111) substrate 101 or part of substrate region 101a of isolated island 110 by etching, is obtained as a semiconductor thin film. This semiconductor thin film is referred to as single crystal Si (111) thin-film device 112. FIG. 2C is a perspective view schematically showing single crystal Si (111) thin-film device 112 which is separated from Si (111) substrate 101. Note that single crystal Si (111) thin-film device 112 comprises circuit/device forming region 102a and part 101b remaining after lateral etching along the (111) plane of a lower region of a separation region for separating isolated island 110 from Si (111) substrate 101 or a region including part of substrate region 101a of isolated island 110. Circuit/device forming region 102a of single crystal Si (111) thin-film device 112 includes an inter-layer insulating film or a single layer or multilayer wiring region including metal thin-film wiring, in addition to the single crystal Si (111) region.

The inventor demonstrated for the first time that superior flatness can be obtained on separated surface A of single crystal Si (111) thin-film device (single crystal Si (111) thin film) 112 by anisotropic etching along the Si (111) plane and thus separating isolated island 110. Although not shown in the figures, description is provided of a measurement result, which was obtained by inter-atom force microscopy (AFM), of flatness of separated surface A of single crystal Si (111) thin-film device 112 separated from Si (111) substrate 101 of the first substrate. Separated surface A of single crystal Si (111) thin-film device 112 separated from Si (111) substrate 101 of the first substrate has flatness in the order of a nanometer, and it is confirmed that flatness (level difference between a peak and a valley (peak-to-valley roughness)) of separated surface A (bonding surface) of single crystal Si (111) thin-film device 112 measured in an area of 5 μm² is extremely favorable, that is, $R_{PV} \leq 0.2$ nm regarding the level difference in short range unevenness and $R_{PV} \leq 1.6$ nm regarding the level difference in long range unevenness (unevenness inclination, 1.56 nm/768 nm≈1/500). It is also confirmed that the flatness is approximately equivalent at different measurement positions on separated surface A. Herein short range unevenness means unevenness for example, in the range of 100 nm or less. Long range unevenness means unevenness in a range, for example, of 0.5 μm to 1 μm or higher.

Separated surface A improved flatness compared to the separated surface of a GaAs based semiconductor thin film obtained by selectively etching a sacrificing layer experimentally evaluated by the inventor. Specifically, in the structure of the GaAs layer/sacrificing layer/GaAs substrate fabricated by an MOCVD method, an isolated island of the GaAs layer is formed in such a manner that the sacrificing layer is exposed. Then, the sacrificing layer is selectively and chemically etched to separate the GaAs layer from the GaAs substrate. The flatness of the separated surface of the GaAs layer is measured in an area of 5 μm² with the AFM. Although not shown, the level difference in short range unevenness ($R_{PV}$) is $R_{PV} \leq 1.4$ nm. Irrespective of the measurement position, approximately equivalent flatness is observed within the separated surface plane.

It is also confirmed that separated surface A that the inventor experimentally compared has improved flatness, even in comparison to the flatness of a separated surface of a Si layer (Si isolated island) which is separated by etching an $SiO_2$ layer, of an SOI substrate, as a sacrificing layer. Although not shown, a measurement result obtained by the inventor is described. Specifically, an $SiO_2$ layer of an SOI substrate (the substrate is an Si (100) substrate, and an Si layer on the $SiO_2$ layer is an Si (100) layer) is selectively etched using a hydrofluoric acid based etchant so that the Si (100) layer is separated from the Si (100) substrate. Then, the flatness of the separated surface of the Si (100) layer was measured with the AFM in an area of 5 μm². The level difference of the short range unevenness, $R_{PV}$, is 2.3 to 3 nm. Results of measurements at multiple points in the separated surface plane show that RPV varies and the structure of unevenness also varies. Thus, variation in $R_{PV}$ unevenness in the separated surface plane is observed. Since flatness (unevenness) of the separated surface of the Si layer separated from the SOI substrate varies depending on the measurement position, that is, unevenness of the surface observed using the AFM widely varies in the separated surface plane, it can be said that the state of the $SiO_2$/Si substrate interface in the SOI substrate varies, compared with the homogeneity (crystal homogeneity) in the single crystal Si substrate.

The results of experiments by the inventor are now described. In an experiment in which the separated GaAs layer and the Si (100) layer are to be in direct close-contact and bonded to a bonding layer provided on the substrate at room temperature without using an adhesive, a separated surface of the GaAs layer (flatness of the separated surface: $R_{PV} \approx 1.4$ nm) is able to be directly contacted, bonded to, and fixed on the bonding layer. However, the separated surface of the Si (100) layer having an uneven structure, for example, flatness $R_{PV}$ being 2.3 to 3 nm, was not able to be in favorable direct close-contact with the bonding layer and was thus not able to be directly bonded to and fixed on the bonding layer. This is because the unevenness of the bonding surface of the Si thin film separated from the SOI substrate is as high as $R_{PV} \approx 2.3$ nm to 3 nm and the flatness of the bonding surface varies in the bonding surface plane.

As described above, the inventor experimentally verified the following for the first time. In the experiment, the separated surface of the single crystal Si (111) thin film according to the embodiment achieved extremely excellent flatness, compared with the flatness of the separated surface of the GaAs layer separated from the GaAs substrate by etching a sacrificing layer and the flatness of the separated surface of the Si (100) layer separated from the Si (100) substrate by etching the $SiO_2$ layer of the SOI substrate as a sacrificing layer. Consequently, direct close-contact bonded state was achieved, which could not be achieved using the separated surface of the Si layer separated from the SOI substrate as a bonding surface.

Additionally, when the separated surface of the single crystal Si thin film, which is separated from the SOI substrate by etching the $SiO_2$ layer, is polished by CMP, the separated surface of the single crystal Si thin film cannot be flattened by CMP. This is because the single crystal Si thin film is thin and thus cannot be firmly supported so as to withstand CMP, so that a crack or defect occurs in the single crystal Si thin film.

When a semiconductor layer separated from a base material substrate is to be placed in direct and close contacted and bonded to a different substrate or on a bonding layer provided on a different substrate, the flatness of the bonding surface of the semiconductor layer is critical. A conceivable methods of bonding the semiconductor layer separated from the base material substrate to a heterogeneous substrate or to a bonding layer provided on the heterogeneous substrate, by directly and closely contacting the surface to be bonded without using an adhesive, is to use inter-molecular forces between the surfaces to be bonded (inter-molecular force bonding) or to form a strong binding such as covalent binding at the bonding interface, or the like.

In particular, in a binding method such as the inter-molecular bonding method or the covalent binding, it is possible to ease the bonding conditions by placing the surfaces to be bonded in as close proximity as possible. Easing the bonding conditions means that loads or temperatures necessary for bonding can be reduced, i.e., a wide range of conditions necessary for favorable bonding can be achieved. Thus, achieving a separated surface having extremely high flatness can be very beneficial to achieving bonding to a heterogeneous substrate under easier bonding conditions.

In addition, in bonding a single crystal Si (111) thin-film device of the embodiment, an extremely flat separated surface is directly bonded to a high thermal conductive substrate or to a high thermal conductive bonding layer on a high thermal conductive substrate. Thus, adhesion of the bonding surfaces is excellent, heat resistance in the bonded interface or the bonding layer can be reduced, and high radiation of the single crystal Si (111) thin-film device is achieved.

In the embodiment an anisotropic etchant is used in etching the Si (111) substrate of the first substrate. That is to say, in the etching, etching rate in a depth direction perpendicular to the Si (111) plane is low and etching rate in a direction parallel to the Si (111) plane is high. In other words, the characteristic that is used is the fact that the etching rate in the direction parallel to the Si (111) plane along the bottom face of isolated island 110 is high. Thus, the thickness of Si (111) substrate 101 of the first substrate after isolated island 110 is etched and separated, depends on the size of isolated island 110 to be separated (the size of an area which is to be etched and lies under the bottom face of isolated island 110). For example, a change in thickness of Si (111) substrate 100 of the first substrate involved in the anisotropic etching for separating isolated island 110, 100 µm square, is 3 µm to 4 µm. Thus, there is a small change in thickness of the Si (111) substrate of the first substrate in the separating step of isolated island 110. Accordingly, the object of the first embodiment of the invention achieved by the anisotropic etching in the direction parallel to the Si (111) plane.

Figure 3A:
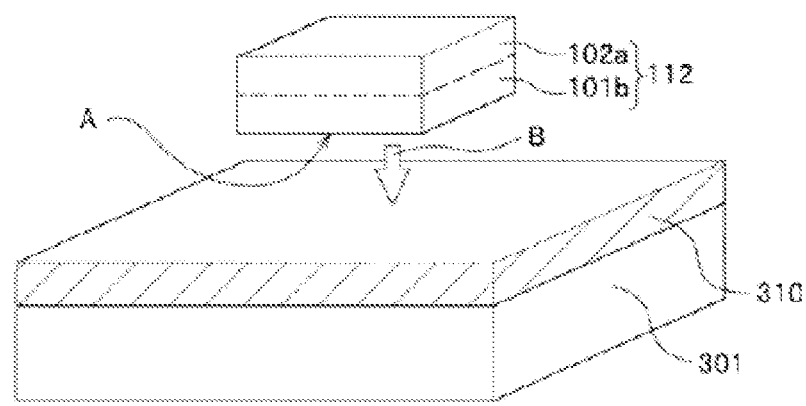
FIG. 3A and FIG. 3B are perspective views illustrating a manufacturing step of bonding by directly contacting the single crystal Si (111) thin-film device in the first embodiment with a bonding layer forming a surface of a second substrate.
Figure 3B:
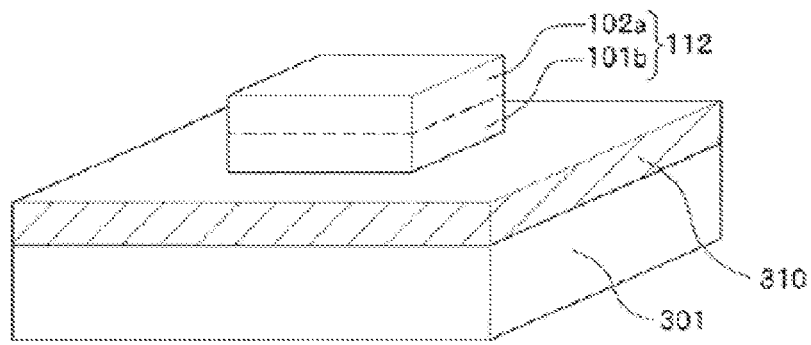

With reference to FIG. 3A and FIG. 3B, described is a step of bonding single crystal Si (111) thin-film device 112 to a surface of second substrate 301 of single crystal Si (111) thin-film device 112 obtained as a result of separation of isolated island 110. As shown in FIGS. 3A and 3B, bonding layer 310 may coat second substrate 301.

Characteristics of bonding layer 310 on the surface of second substrate 301 are, for example, uniformity of the bonding interface with small variation, adhesion with no voids, firm bonding strength, or the like. Bonding layer 310 is, for example, an insulating film material layer such as SiN, SiON, SiO$_2$, Al$_2$O$_3$, AlN or the like; an oxide material layer or a transparent conductive material layer such as ITO, ZnO or the like; an organic material layer such as polyimide, BCB or the like; an organic conductive material layer; a metal layer, an alloy layer, a metal composite layer (laminated metal layers) which is selected from Au, Ge, Ni, Ti, Pt, Cu; or the like.

In addition, second substrate 301 is a compound semiconductor substrate such as a Si substrate, a GaAs substrate, a GaP substrate, an InP substrate or the like; a nitride semiconductor substrate such as a GaN substrate, an AlN substrate, an Al$_x$Ga$_{1-x}$N substrate (1≥x≥0), an In$_x$Ga$_{1-x}$N substrate (1≥x≥0), an Al$_x$In$_{1-x}$N substrate (1≥x≥0) or the like; a glass substrate; a quartz substrate; a ceramics substrate such as AlN or PBN or the like; sapphire substrate; an oxide substrate such as Linb$_3$, MgO, GaO$_3$ or the like; a plastic substrate such as PET, PEN or the like; a metal substrate such as stainless, nickel, copper, brass, aluminum or the like; a plated metal substrate obtained by plating a metal substrate with nickel or copper; a diamond substrate; a diamond-like carbon substrate; or the like. In addition, although bonding layer 310 is provided as shown in FIG. 3, a configuration in which single crystal Si (111) thin-film device 112 is directly bonded to the surface of second substrate 301 without providing bonding layer 310 is also an option.

In the bonding step, in addition to using intermolecular forces to be described later, it is preferable to use a bonding form in which binding such as covalent binding between bonding interfaces is achieved. Since the typical thickness of a single crystal Si (111) thin film is as thin as 10 µm or less, adhesion of the film using an adhesive involves risk of a defect, reliability deterioration, and the like. However, from the standpoint of fixing the single crystal Si (111) thin film on a different substrate, adhesion using an adhesive is also an option.

As shown in FIG. 3A, after cleaning and activation treatment of separated surface A of single crystal Si (111) thin-film device 112 and the surface of bonding layer 310, separated surface A of single crystal Si (111) thin-film device 112 is pressed in close contact with the surface of bonding layer 310 at room temperature. Thereby, separated surface A of single crystal Si (111) thin-film device 112 is bonded to the surface of bonding layer 310 formed on the surface of second substrate 301 of the different substrate (see the arrow B (bonding step) in FIG. 3A). Consequently, both are bonded (FIG. 3B).

A heating step can be added to the close contact pressing step, depending on the characteristics of the material to be bonded. As described above, separated surface A of single crystal Si (111) thin-film device 112 is an extremely flat separated surface with $R_{PV}$≤0.5 nm. Thus, surfaces to be bonded can be placed in proximity in the order of a nanometer, thereby making it possible to increase the intermolecular forces acting between the bonding surfaces. Hence, in the bonding step, with the intermolecular forces acting between the bonding surfaces, strong bonding can be achieved. As the flatness of the separated surface of single crystal Si (111) thin film 112 is extremely favorable, in the step of directly attaching and fixing the separated surface of single crystal Si (111) thin film 112 to the bonding layer, there is no need to heat the separated surface to a high temperature and favorable bonding is possible at low temperature such as less than 200° C. or even at room temperature.

Figure 4:
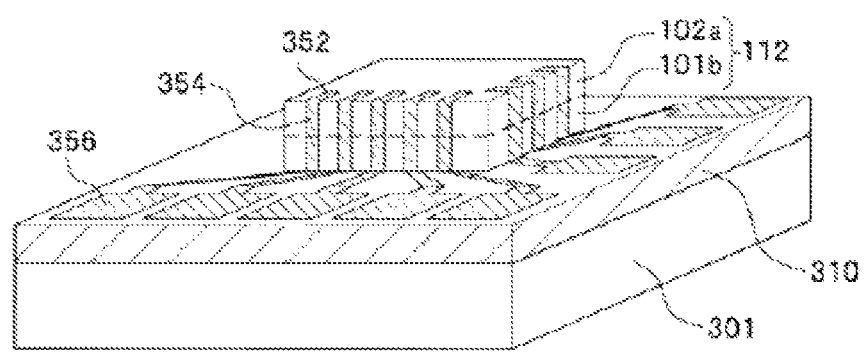
FIG. 4 is a perspective view illustrating a manufacturing step of attaching electrode wires or the like to the bonding layer of the surface of the second substrate, to a circuit/device forming region of the single crystal Si (111) thin-film device bonded in the first embodiment.

Next, as needed, removal of the support and coating layer 210 or the like is executed. Then, as shown in FIG. 4, fabrication process to make the devices functional on single crystal Si (111) thin-film device 112 and on bonding layer 310 formed on second substrate 301. Bonding layer 310 may be provided on a wide area of substrate 301, and additional design changes may be allowed as appropriate. For example, bonding layer 310 is provided only on the lower part or near bonded single crystal Si (111) thin-film device 112, and the like. The fabrication process to make the devices functional means a fabrication process on circuit/device forming region 102a, that is to say, formation of an interlayer insulating film, electrodes, wirings, connection pads (352, 354, 356 in FIG. 4), or the like.

FIG. 4 is a perspective view of the embodiment in which single crystal Si (111) thin-film device 112, separated from Si (111) substrate 101 of the first substrate, is bonded to the surface of bonding layer 310 formed on the surface of second substrate 301 of the different substrate, and electrode 352 and wirings 354 and external connection pads 356 are formed, for connecting to circuit devices of circuit/device forming region 102a of single crystal Si (111) thin-film device 112.

As an alternative configuration, an integrated device may be configured such that plural devices having different functions are formed on second substrate 301 and are electrically or optically connected to circuit/device forming region 102. Alternatively, an integrated device may be configured such that multiple single crystal Si (111) thin-film devices 112 are bonded to each other and bonded to the surface of second substrate 301.

Figure 5:
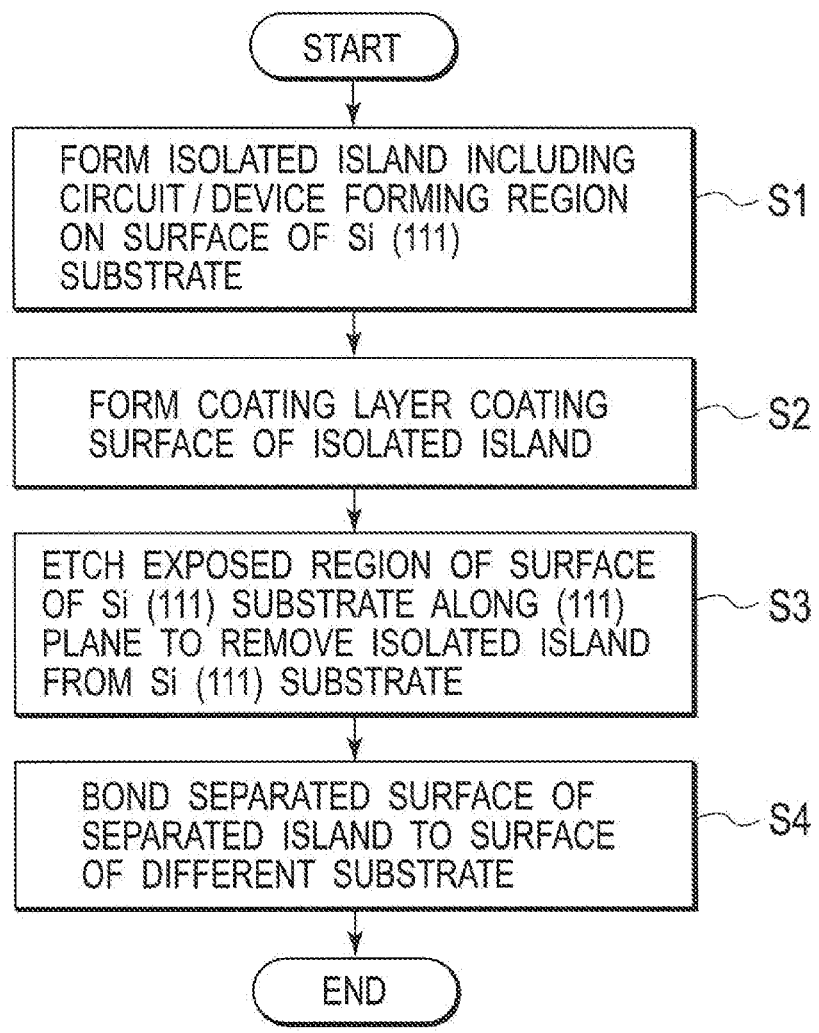
FIG. 5 is a flowchart of the main manufacturing steps illustrating a method for manufacturing a semiconductor device of the first embodiment.

FIG. 5 is a flowchart illustrating a method for manufacturing a semiconductor device in the first embodiment of the invention. The main manufacturing process includes steps of: forming an isolated island including a circuit/device forming region on a surface of an Si (111) substrate (step S1); forming a coating layer that coats the surface of the isolated island (step S2); etching an exposed area of the surface of Si (111) substrate along the (111) plane and separating the isolated island from the Si (111) substrate (step S3); and bonding the separated surface of the separated isolated island to a surface of a different substrate (step S4).

In addition, bonded single crystal Si (111) thin-film device 112 can include circuit elements made of Si. Such circuit elements may include a p-n junction structure, a MOS structure, a structure such as a capacitor/resistor/coil or the like, or an electrode/wiring structure or the like. In addition, single crystal Si (111) thin-film device 112 can include an electric/electronic device such as a sensor device, a solar cell device, a high-frequency device or the like, which is made of Si, an optical device such as a waveguide, a reflecting mirror or the like, a composite element thereof, or the like. Furthermore, single crystal Si (111) thin-film device 112 may include an antenna device, a piezoelectric device, a light emitting device or the like on the upper part of the Si thin film. Single crystal Si (111) thin-film device 112 may also include a material other than Si on the Si layer, for example, a heterogeneous semiconductor material layer such as SiGe, a compound semiconductor or the like.

In addition, in the embodiment, since separated single crystal Si (111) thin-film device 112 can be bonded to the heterogeneous material substrate as described above, the Si device having a structure similar to a device using an existing SOI substrate or an SOS (Silicon on Sapphire) substrate can be implemented.

In contrast, since material of a SOI substrate or a SOS substrate is more expensive than the Si substrate and a SOI substrate or a SOS substrate is scribed in manufacturing devices in the substrate, it is not possible to reuse the SOI substrate or the SOI substrate.

The first embodiment may be summarized by the following list.

(1) The first embodiment includes: the step of separating the isolated island including the circuit/device forming region, which is an upper layer of the Si (111) substrate, by anisotropic etching along the (111) plane; and the step of bonding the separated single crystal Si (111) thin-film device to the surface of the second substrate of the different substrate. Thus, there is no need to provide a sacrificial layer for executing selective etching during the separating step, and a single crystal (Si) thin film can be obtained by using inexpensive substrates with a large diameter. In addition, there is no need to remove the Si (111) substrate by etching, polishing or the like in a thickness direction during the separating step. Thus, a single crystal Si thin film can be obtained through the simple and inexpensive manufacturing process.

(2) The separated surface of the single crystal Si (111) thin-film device has extremely high flatness and thus the distance between bonding surfaces can be in the order of a nanometer. Thus, a number of bonding configurations can be used including not only intermolecular force bonding but also bonding using a chemical binding such as covalent binding or the like and bonding using an adhesive or the like. Accordingly, the bonding conditions can be eased.

(3) A thin-film device made of single crystal Si can be placed in direct and close contact, bonded, and then fixed onto a different substrate or a bonding layer provided on the different substrate. Thus, high-quality/high-performance devices having different materials as base materials or different functions can be integrated in high density, while maintaining quality and performance. In addition, as mobility of a Si (111) carrier is higher than Si (100), a high density and multi-functional integrated device can be obtained which makes full use of the characteristic of faster operation. Additionally, in bonding the single crystal Si (111) thin-film device of the embodiment, there is no need to add a flattening layer for bonding, and an extremely flat separated surface can be directly bonded to a substrate with high thermal conductivity such as a metal substrate or the like and to a bonding layer with high thermal conductivity such as a metal layer, an AlN layer, a diamond-like carbon layer or the like. Accordingly, it is possible to provide excellent adhesion of a bonded interface, reduce heat resistance in the bonded interface and the bonding layer, and thus achieve high radiation performance of the single crystal Si (111) thin-film device.

(4) Furthermore, a structure in which the single crystal Si is firmly bonded onto the insulating film layer can be manufactured, and thus semiconductor devices having performance and functions comparable to devices using SOI substrates or SOS substrates which are manufactured by wafer bonding or the like can be manufactured at low cost.

(5) According to the manufacturing method of the embodiment, the thickness of the Si (111) substrate of the first substrate after separation of the isolated island does not widely vary from the initial thickness, and the Si (111) substrate remains in a state where the surface thereof has favorable flatness. Hence, the Si (111) substrate can be reused, and saving of substrate materials can be achieved.

Modification

The first embodiment was described by using as an example the configuration in which a single crystal Si (111) thin-film device separated from the Si (111) substrate is bonded to a different substrate. However, it is possible to make the thickness of the single crystal Si (111) thin-film device to be separated from the Si (111) substrate a thickness that allows the single crystal Si (111) thin-film device to standby itself and thereby obtain a self-standing Si piece (Si chip) after the separation from the Si (111) substrate. Being capable of standing by itself, the self-standing Si chip can be used as a self-standing and individual chip.

As in the first embodiment, the self-standing Si piece can include not only various devices and components but also a circuit element made of Si. That is to say, the self-standing Si piece can include a sensor device, a solar cell device, an electric device, a high-frequency device or the like which are made of Si.

Furthermore, the self-standing Si piece can include an optical device having a waveguide or reflecting mirror or the like, a composite device thereof, or the like. Additionally, the self-standing Si piece may include an antenna device, a piezoelectric device, a light emitting device or the like on the upper part of the isolated island. Alternatively, the self-standing Si piece may include a material other than Si, for example, a heterogeneous semiconductor material layer such as SiGe, a compound semiconductor or the like.

Second Embodiment

A second embodiment of the invention is described with reference to FIG. 6A and FIG. 6B. The second embodiment provides a semiconductor composite chip in which the single crystal Si (111) thin-film device described in the first embodiment (hereinafter referred to as an Si (111) thin-film integrated device) and one-dimensionally arranged light emitting devices (hereinafter referred to as a single crystal compound semiconductor thin film) are bonded and integrated on a single substrate, the Si (111) thin-film integrated device including the circuit/device forming regions separated from the Si (111) substrate.

Figure 6A:
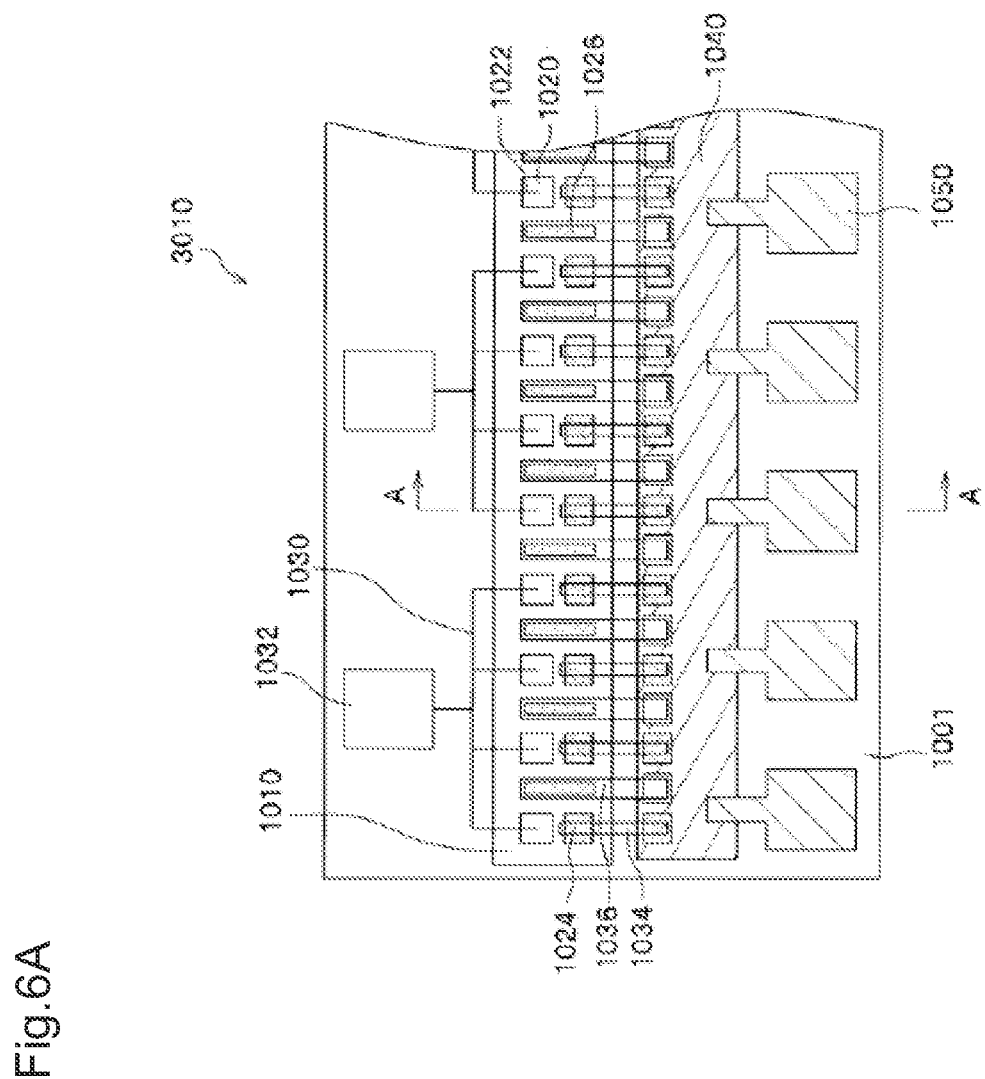
FIG. 6A is a plan view of a semiconductor composite chip in a second embodiment of the invention.

FIG. 6A is a plan view for illustrating semiconductor composite chip 3010 of the embodiment. In semiconductor composite chip 3010 single crystal compound semiconductor thin film 1010 and Si (111) thin-film integrated device 1040 are bonded and integrated on a surface of substrate 1001.

For example, substrate 1001 is a Si substrate. In addition, substrate 1001 may be of a glass substrate, a ceramics substrate, a plastic substrate such as PET, PEN or the like, a metal substrate such as stainless, nickel, copper, brass, aluminum or the like, a plated metal substrate obtained by plating a metal substrate with nickel or copper, or the like.

Si (111) thin-film integrated device 1040 is an Si (111) thin-film integrated device which is separated from the Si (111) substrate, directly contacted, bonded, and fixed to substrate 1001 or to bonding layer 1112 provided on a surface of substrate 1001. Si (111) thin-film integrated device 1040 includes a group of CMOS integrated circuits for driving single crystal compound semiconductor thin film 1010, the CMOS integrated circuits including, for example, a shift register circuit in the circuit/device forming region. Si (111) thin-film integrated device 1040 has preferably $R_{PV} \leq 2$ nm as flatness of the bonded surface (separated surface), more preferably $R_{PV} \leq 1$ nm. It is also preferable that Si (111) thin-film integrated device 1040 is bonded to the surface of substrate 1001 by intermolecular bonding or bonding such as covalent binding or the like.

Single crystal compound semiconductor thin film 1010 is a thin film including an array of light emitting diodes, and is a single crystal compound semiconductor thin film, for example. More specific examples of materials include a single crystal semiconductor thin film formed of a GaAs layer including a p-n junction, and an AlGaAs layer. Single crystal compound semiconductor thin film 1010 is in direct closecontact with substrate 1001 or bonding layer 1112 provided on substrate 1001, bonded by an intermolecular force (intermolecular force bonding) and fixed thereto.

In single crystal compound semiconductor thin film 1010, multiple light emitting devices including light emitting regions 1020, first electrodes 1022, second electrodes 1024, and third electrodes 1026 for controlling light emission, respectively, are formed in an array. The light emitting devices include a first p-n junction and a second p-n junction, and include first electrodes 1022 as an electrode of a first conductive type, second electrodes 1024 as a first electrode of a second conductive type, and third electrodes 1026 as a second electrode of the second conductive type. For example, third electrodes 1026 are common electrodes for the array of the light emitting devices.

Second electrodes 1024 and third electrodes 1026 in single crystal compound semiconductor thin film 1010 are respectively connected via thin-film wirings 1034 and thin-film wirings 1036 as wirings to Si (111) thin-film integrated device 1040. For example, Si (111) thin-film integrated device 1040 includes a circuit for controlling the ON state of each of the light emitting devices for second electrode 1024 terminals of single crystal compound semiconductor thin film 1010 via thin-film wirings 1034. Thin-film wirings 1034 and thin-film wirings 1036 are formed of metal thin-film wirings. The thin-film wirings to Si (111) thin-film integrated device 1040 are each structured to extend over the side of Si (111) thin-film integrated device 1040.

Then, as a configuration of external input wirings of semiconductor composite chip 3010, common wirings 1030 for the first electrodes 1022 are connected to first electrodes 1022 of multiple light emitting diodes of single crystal compound semiconductor thin film 1010, and first common wirings 1030 are connected to first common wiring connection pads 1032 on substrate 1001. In addition, provided as wirings to Si (111) thin-film integrated device 1040 on substrate 1001, connection pads 1050 are external input wiring pads which are formed on Si (111) thin-film integrated device 1040 for supplying power and inputting signals to the group of CMOS integrated circuits including, for example, the shift register circuit.

Thus, semiconductor composite chip 3010 of the embodiment has the following configuration. Single crystal compound semiconductor thin film 1010 including the light emitting devices and Si (111) thin-film integrated device 1040 for driving the light emitting devices are in direct and close contact, bonded, and fixed on the separated surface, as a bonding surface, of substrate 1001 or on bonding layer 1112 provided on substrate 1001. Then, both are connected by the thin-film wirings. The light emitting devices, which are components of single crystal compound semiconductor thin film 1010, each include the first p-n junction, the second p-n junction, and three electrodes of the first electrode 1022, second electrode 1024 and third electrode 1026. Si (111) thin-film integrated device 1040 includes a circuit for controlling current flowing between first electrode 1022 and third electrode 1026 by using second electrode 1024, and controlling the ON state of each of the light emitting devices.

Figure 6B:
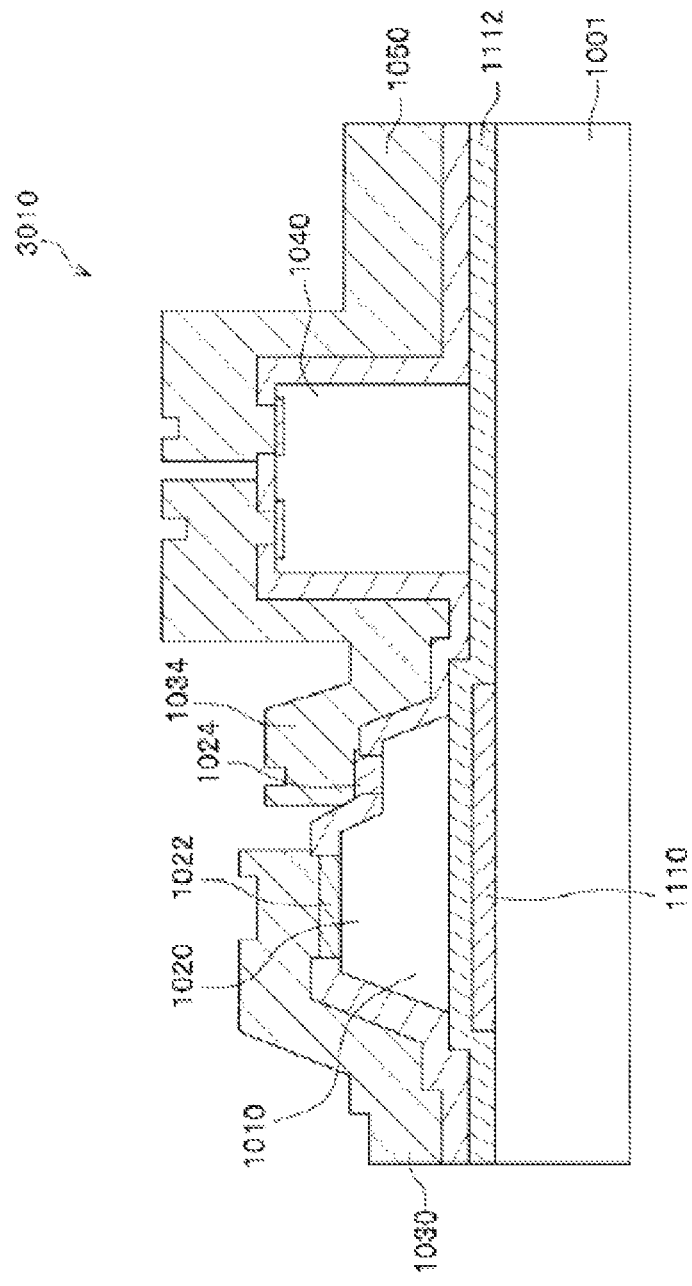
FIG. 6B is a cross sectional view of the semiconductor composite chip in the second embodiment.

FIG. 6B is a cross sectional view showing a cross section of semiconductor composite chip 3010 taken along the A-A line of FIG. 6A. Note that, in FIG. 6B, the same reference numerals are given to common elements shown in FIG. 6A.

On substrate 1001, metal layer 1110 is provided for the light emitting devices. Metal layer 1110 serves as a reflective film (HR film) which reflects light emitted from light emitting region 1020 of each of the light emitting devices in a direction to substrate 1001 and reflects the light to the surface side of the light emitting device, which is a display direction of the light emitting device. In addition, bonding layer 112 is a bonding layer for intermolecular force bonding (for directly and closely contacting and bonding surfaces to be bonded, and fixing the surfaces on bonding layer 1112) to single crystal compound semiconductor thin film 1010, and is, for example, an insulating film such as an $SiO_2$ film, an SiN film, an SiON film, an $Al_2O_3$ film, an AlN film, a diamond-like carbon film or the like, or an organic film.

FIG. 6B shows the state in which Si (111) thin-film integrated device 1040 is bonded on bonding layer 1112 (intermolecular force bonding, for example). However, the bonding of single crystal compound semiconductor thin film 1010 including the light emitting devices and Si (111) thin-film integrated device 1040 may alternatively be configured as follows. The separated surfaces of the semiconductor thin films of single crystal compound semiconductor thin film 1010 and Si (111) thin-film integrated device 1040 may be in direct close-contact, bonded, and fixed to bonding layer 1112 by using the separated surfaces thereof as the bonding surfaces. In this case, intermolecular force bonding is employed for the bonding. As another case, bonding using an intermolecular force (intermolecular bonding) acting on the bonding surfaces may be employed for bonding single crystal compound semiconductor thin film 1010 including the light emitting devices, while bonding using strong binding such as covalent binding or the like is employed for bonding Si (111) thin-film integrated device 1040.

According to the second embodiment of the invention, the following configuration can be implemented. Specifically, separated surfaces of single crystal compound semiconductor thin film 1010 including the light emitting devices and Si (111) thin-film integrated device 1040 are in direct and close contact, bonded and fixed on substrate 1001 or on bonding layer 1112 provided on substrate 1001, by using the separated surfaces thereof as the bonding surfaces. In addition, the light emitting devices and the integrated device are connected by the thin-film wirings. Consequently, the light emitting devices and the driving integrated device can be integrated on the substrate in higher density than the conventional configuration, and a highly reliable composite semiconductor device can be implemented in a compact configuration a and at low cost. Furthermore, in the configuration, the single crystal compound semiconductor thin film and the Si (111) thin-film integrated device are directly bonded to the substrate or the bonding layer provided on the substrate by using the separated surfaces having extremely favorable flatness as the bonding surfaces. Accordingly, a semiconductor device with high radiation performance can be implemented by using a substrate with high thermal conductivity such as a metal substrate and a bonding layer with high thermal conductivity such as a metal layer, an AlN layer, a diamond-like carbon layer or the like.

Furthermore, the light emitting devices include the first p-n junction and the second p-n junction, and the three electrodes of the first to third electrodes. In addition, Si (111) thin-film integrated device 1040 includes a circuit for controlling the ON state of each of the light emitting devices via the second electrode of the light emitting device. Thus, the group of CMOS integrated circuits of Si (111) thin-film integrated device 1040 for controlling light emission of the light emitting devices can be reduced in size. Accordingly, the effect of integrating the group of light emitting devices and the group of CMOS integrated driving devices on a heterogeneous substrate in high density can be achieved.

Third Embodiment

Figure 7:
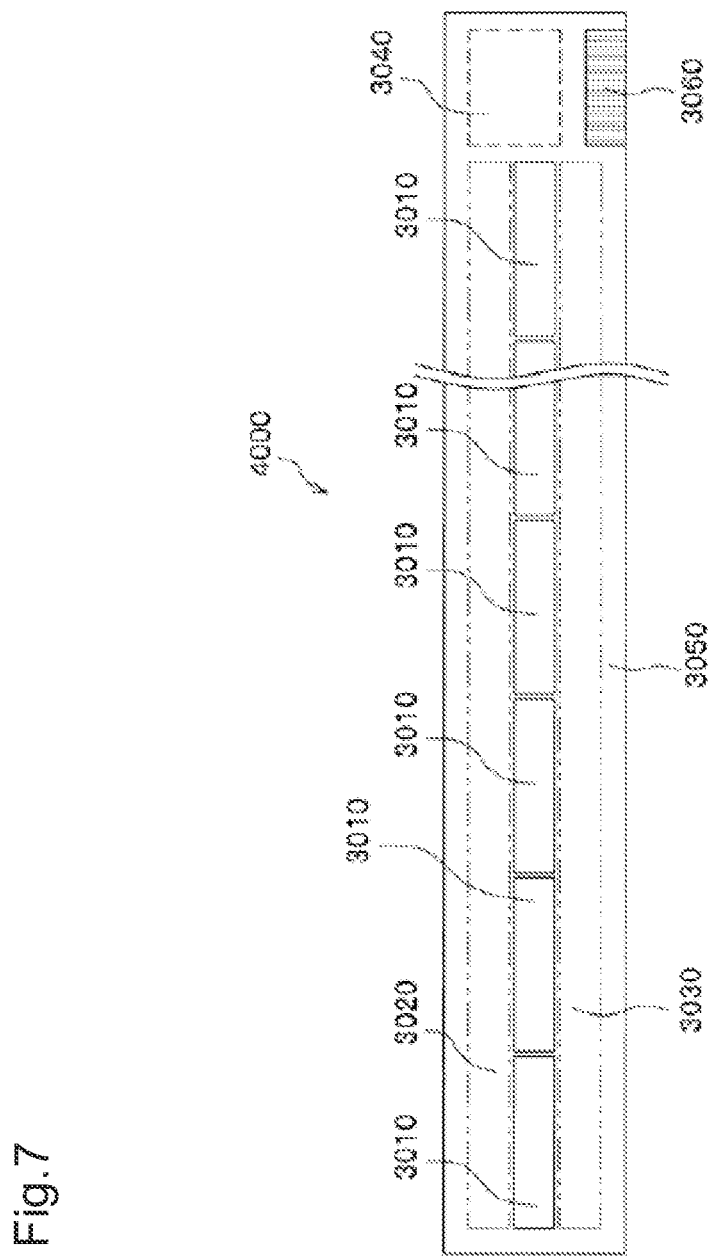
FIG. 7 is a plan view of a one-dimensional light emitting device array light source using a semiconductor composite chip according to a third embodiment of the invention.
Figure 8:
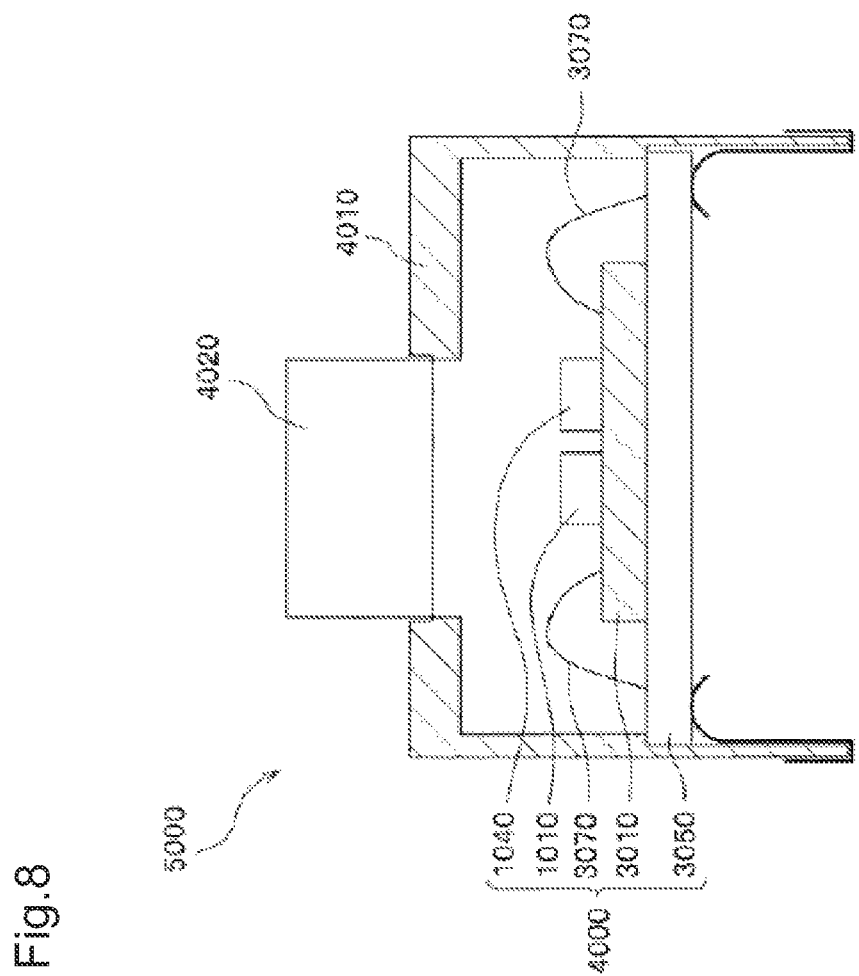
FIG. 8 is a cross sectional view of a LED print head in which the one-dimensional light emitting device array light source in the third embodiment is incorporated.

In a third embodiment of the invention, with reference to FIG. 7 and FIG. 8, a description is given of a configuration of a one dimensional light emitting device array light source in which multiple semiconductor composite chips are arranged one-dimensionally. Each of the semiconductor composite chips includes single crystal compound semiconductor thin film 1010 and Si (111) thin-film integrated device 1040 which are integrated therein, as described in the second embodiment.

In FIG. 7, one-dimensional light emitting device array source 4000 includes multiple semiconductor composite chips 3010 which are one dimensionally arranged on wiring substrate 3050, wiring regions 3020, 3030, chip mount region 3040, and connection terminal 3060.

Wiring substrate 3050 is, for example, a glass epoxy substrate, a metal core wiring substrate including a metal core, a glass substrate, a plastic substrate, a metal substrate, a ceramics substrate or the like.

Wiring regions 3020, 3030 are for supplying power and inputting a control signal to semiconductor composite chip 3010 mounted on substrate 1001 via wirings provided in substrate 1001 from connection terminals to external circuits provided on substrate 1001, and a wiring region for making connections with single crystal compound semiconductor thin film 1010 and Si (111) thin-film integrated device 1040 which are integrated on the wiring and semiconductor composite chip 3010, respectively. Chip mount region 3040 includes an IC chip or the like for controlling the entire one-dimensional light emitting array light source 4000. External connection terminal 3060 supplies power to control one-dimensional light emitting device array light source 4000 and supplies a control signal from the external.

Semiconductor composite chip 3010 is the semiconductor composite chip described in the second embodiment. The connection pads (common wiring connection pad 1032 and connection pad 1050) described in the second embodiment are respectively connected to wiring region 3020 and wiring region 3030 on wiring substrate 3050 by a connection method such as wire bonding or the like.

FIG. 8 is a cross sectional view of LED print head 5000 which is an example and on which one-dimensional light emitting array light source 4000 is mounted. LED print head 5000 includes one-dimensional light emitting device array light sources 4000, rod lens array 4020, and head frame 4010. In the embodiment, connection pads on semiconductor composite chip 3010 are respectively connected to wiring region 3020 and wiring region 3030 on wiring board 3050 by bonding wires 3070.

According to the third embodiment of the invention, the one-dimensional light emitting device array light source 4000 is configured by using the compact semiconductor composite chip on which single crystal compound semiconductor thin film 1010 and Si (111) thin-film integrated device 40 are integrated. Thus, compact one-dimensional light emitting device array light source 4000 and compact LED print head 5000 can be implemented.

Modification

Figure 9A:
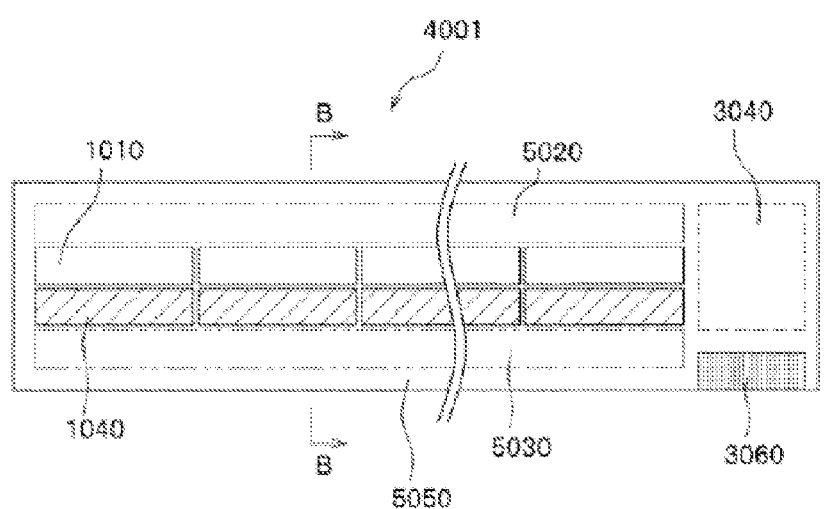
FIG. 9A and FIG. 9B are views illustrating a modification of the one-dimensional light emitting device array light source in the third embodiment.
Figure 9B:
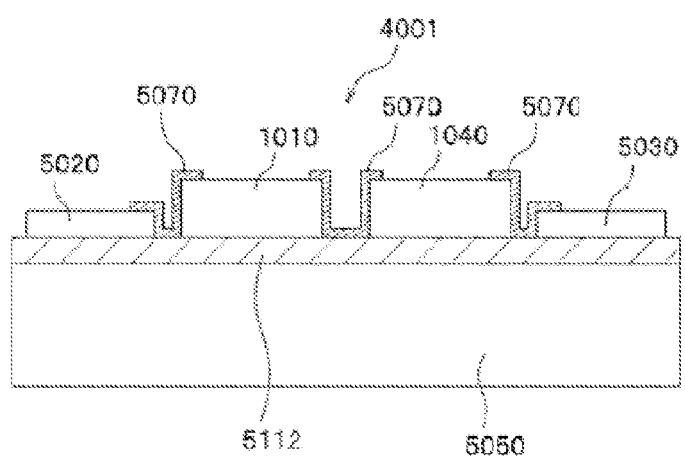

A modification of the one-dimensional light emitting device array light source of the second embodiment and the third embodiment is described with reference to FIG. 9A and FIG. 9B. FIG. 9A is a plan view, while FIG. 9B is a cross sectional view taken along the line B-B of FIG. 9A.

In FIG. 9A, one-dimensional light emitting device array light source 4001 of the modification is configured such that multiple single crystal compound semiconductor thin films 1010 and multiple Si (111) thin-film integrated devices 1040, which are described in the second embodiment, are arranged in rows and bonded on substrate 5050. In the bonding configuration, the separated surface of single crystal compound semiconductor thin film 1010 and Si (111) thin-film integrated device 1040 are in direct and close contact, bonded, and fixed on bonding layer 5112 provided on substrate 5050 by using the separated surfaces thereof as the bonding surfaces. That is to say, the configuration is such that the separated surfaces of single crystal compound semiconductor thin film 1010 and Si (111) thin-film integrated device 1040 are bonded on substrate 5050 or on bonding layer 5112 provided on substrate 5050 by using the separated surfaces thereof as the bonding surfaces, by intermolecular force bonding or bonding using a strong binding such as covalent binding or the like. In addition, connection is established by thin-film wirings 5070 between single crystal compound semiconductor thin film 1010 and Si (111) thin-film integrated device 1040, between single crystal compound semiconductor thin film 1010 and wiring region 5020, and between Si (111) thin-film integrated device 1040 and wiring region 5030. Furthermore, chip mount 3040 and external connection terminal 3060 are provided as in the fourth embodiment.

In addition, substrate 5050 is a glass substrate, a ceramics substrate, a plastic substrate such as PET or PEN or the like, a metal substrate such as stainless steel, nickel, copper, brass, aluminum or the like, a plated metal substrate obtained by plating a metal substrate with nickel or copper, or the like. The description of the other components is finished in the second and third embodiments, and thus is omitted herein.

In addition, a configuration of the modification is described with reference to the cross sectional view shown in FIG. 9B. With the configuration in which multiple single crystal compound semiconductor thin films 1010 and multiple Si (111) thin-film integrated devices 1040 are arranged in rows and are bonded on the surface of bonding layer 5112 of single substrate 5050, thin-film wirings 5070 can connect between single crystal compound semiconductor thin film 1010 and Si (111) thin-film integrated device 1040, between single crystal compound semiconductor thin film 1010 and wiring region 5020, and between Si (111) thin-film integrated device 1040 and wiring region 5030, respectively. Accordingly, the connection by wire bonding described in the third embodiment can be omitted.

With the modification, mounting density can be increased more than one-dimensional light emitting device array light source 4000 of the third embodiment, and reduction in size can be achieved.

Fourth Embodiment

A fourth embodiment of the invention is described with reference to FIG. 10 to FIG. 13. In the embodiment, multiple single crystal compound semiconductor thin films and two Si (111) thin-film integrated devices are bonded on a single substrate, the single crystal compound semiconductor thin films being arranged two-dimensionally, the Si (111) thin-film integrated devices being provided for driving 3-terminal light emitting devices included in each of the multiple single crystal compound semiconductor thin films which are two-dimensionally arranged.

Figure 10:
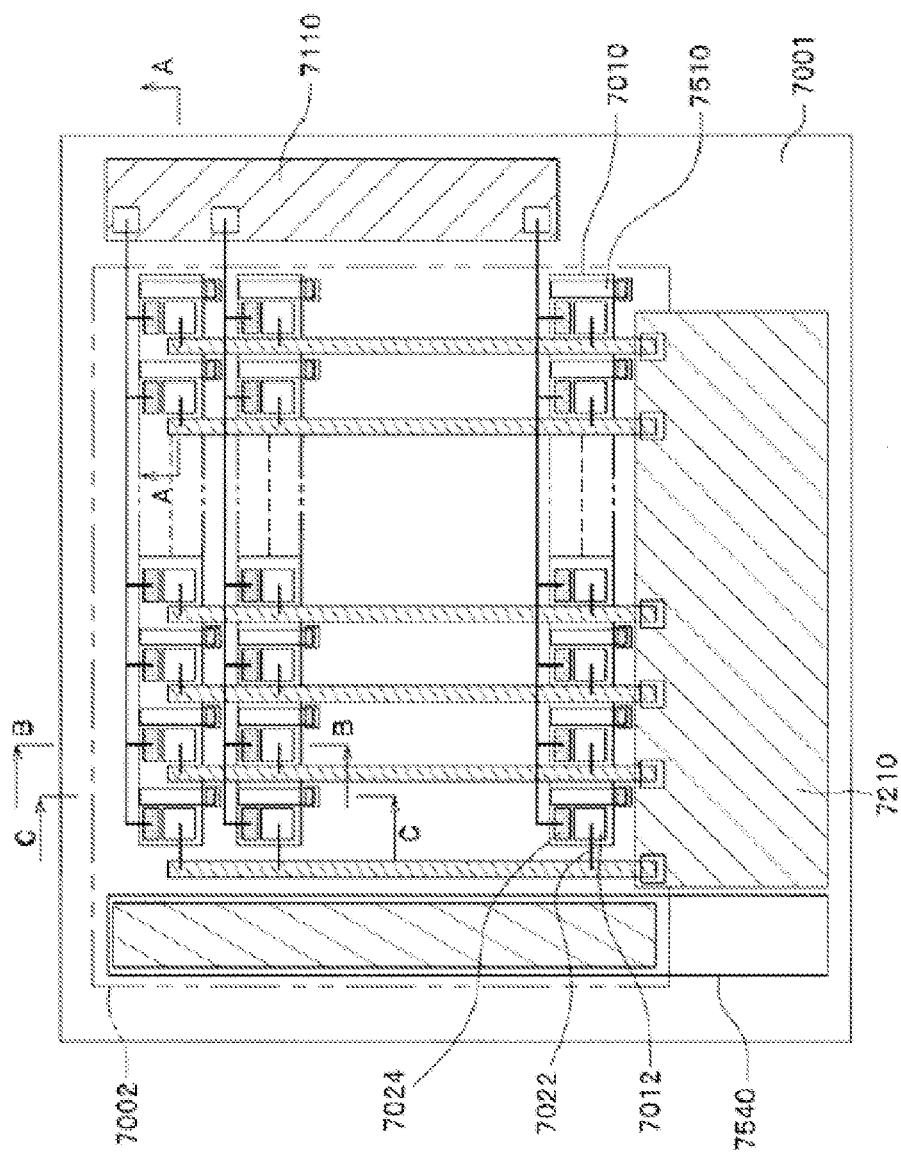
FIG. 10 is a plan view of a 3-terminal light emitting device two-dimensional array and two SI (111) thin-film integrated devices in a fourth embodiment.

FIG. 10 is a plan view for illustrating the fourth embodiment of the invention.

In FIG. 10, metal conductive layer 7002 is provided on substrate 7001, and multiple single crystal compound semiconductor thin films 7010 are two-dimensionally arranged and bonded on metal conductive layer 7002 with connection layer 7004 interposed in between. In addition, two Si(111) thin-film integrated devices are arranged and bonded on substrate 7001 with connection layer 7004 interposed in between, the two Si (111) thin-film integrated devices being first Si (111) thin-film integrated device 7110 and second Si (111) thin-film integrated device 7210.

Substrate 7001 is, for example, a glass substrate, a ceramics substrate, a plastic substrate such as PET or PEN or the like, a metal substrate such as stainless, nickel, copper, brass, aluminum or the like, a plated metal substrate obtained by plating a metal substrate with nickel or copper, or the like.

Metal conductive layer 7002 causes third electrode 7026 of single crystal compound semiconductor thin film 7010 provided on substrate 7001 to serve as a common electrode, and provides the common electrode with a common potential (ground potential). Then, connection wiring 7510 connects common electrode 7026 (FIG. 11) of the light emitting device with metal conductive layer 7002.

Each of single crystal compound semiconductor thin film 7010 includes a group of 3-terminal light emitting devices each having a first p-n junction, a second p-n junction, light emitting region 7012, first electrode 7022, second electrode 7024, and third electrode 7026.

First Si (111) thin-film integrated device 7110 is a Si (111) thin-film integrated device for controlling second electrode 7024 of the light emitting device to control the ON state of the light emitting device, and is a Si (111) thin-film integrated circuit device, for example, including a shift register circuit. In addition, second Si (111) thin-film integrated device 7210 controls first electrode 7022 of the light emitting device to control the ON state of the light emitting device, and is a Si (111) thin-film integrated device, for example, including a shift register circuit, an IC for controlling electric current, or the like.

Figure 11:
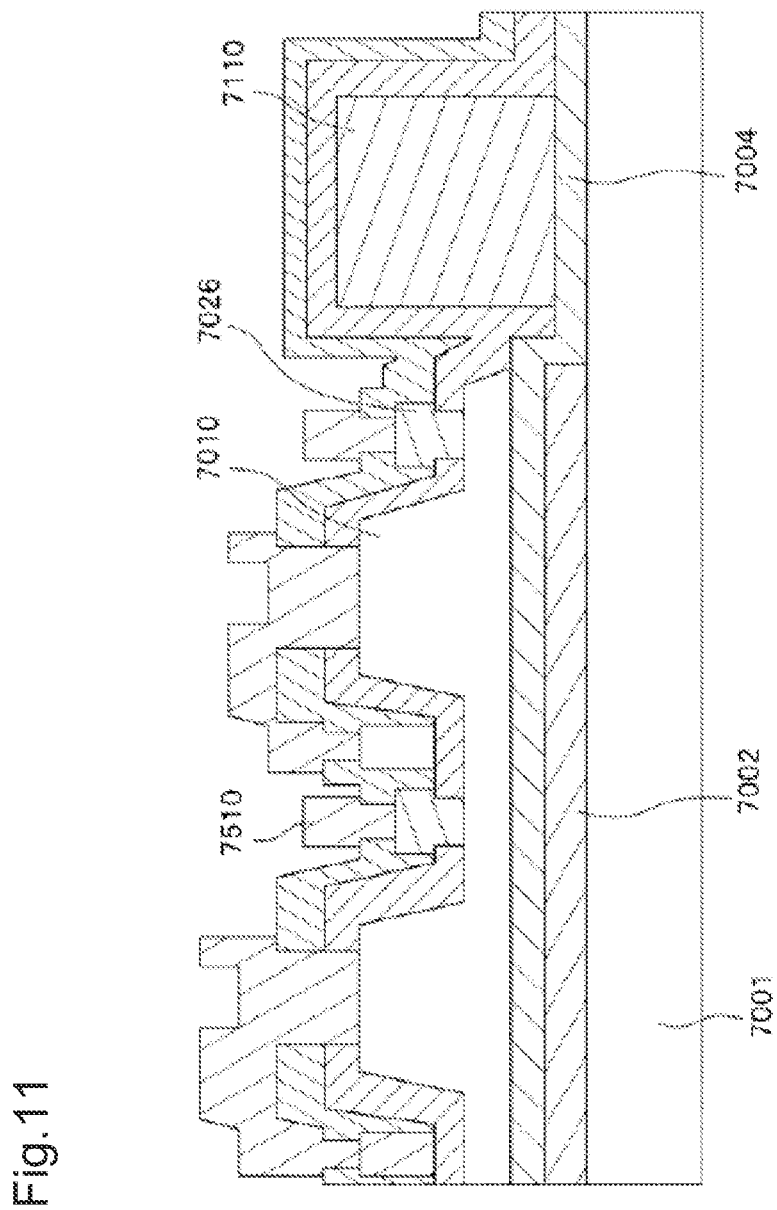
FIG. 11 is a cross section along the line A-A in FIG. 10 in the fourth embodiment.
Figure 12:
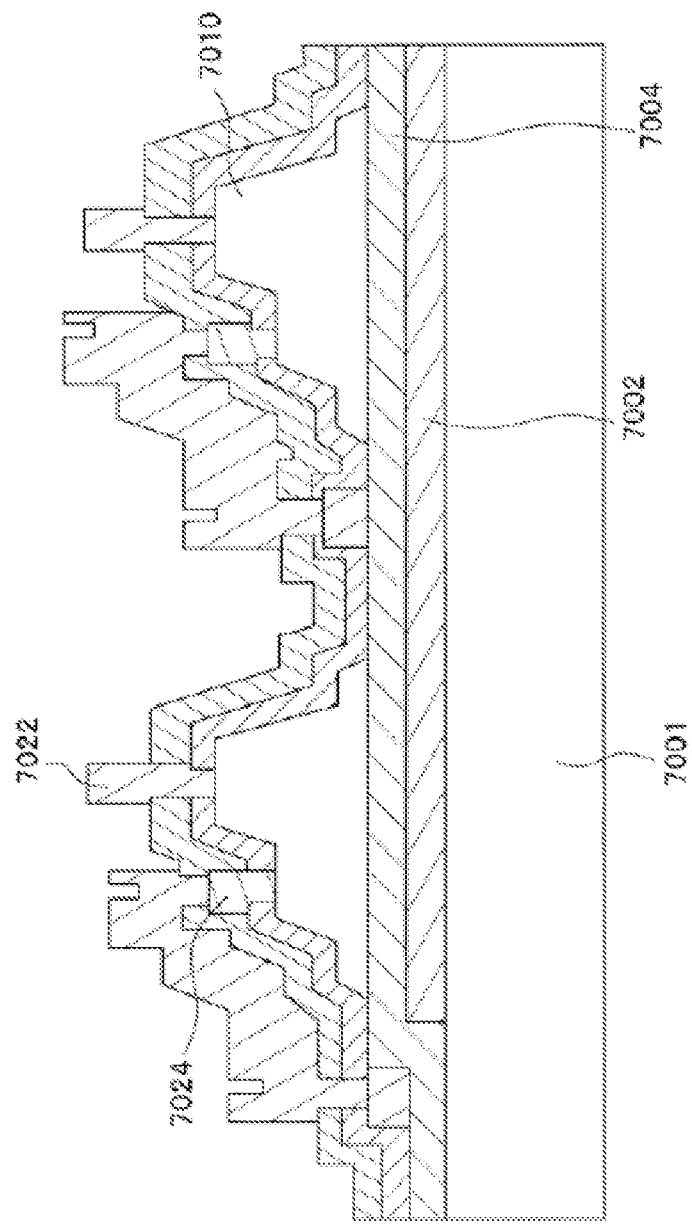
FIG. 12 is a cross section along the line B-B in FIG. 10 in the fourth embodiment.
Figure 13:
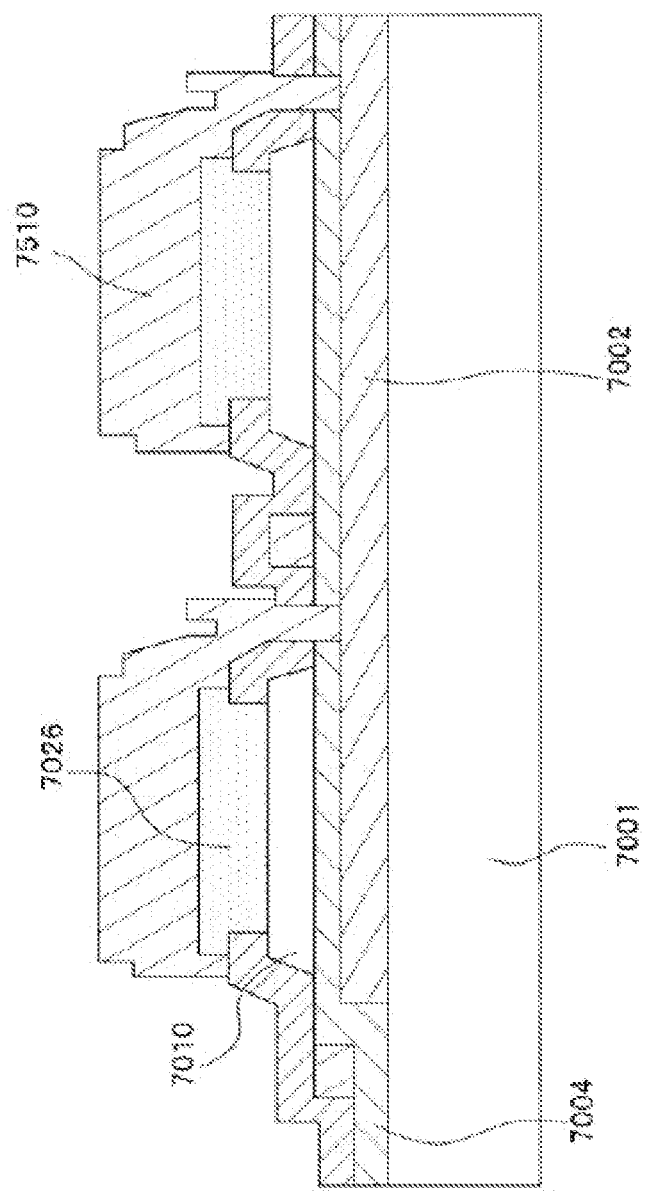
FIG. 13 is a cross section along the line C-C in FIG. 10 in the fourth embodiment.

External connection wiring 7540 is a connection wiring on substrate 7010, which connects a terminal (not shown) for connecting metal conductive layer 7002 and the external of substrate 7001. FIG. 11, FIG. 12 and FIG. 13 respectively show a cross sectional view taken along the line A-A of FIG. 10, a cross sectional view taken along the line B-B, and a cross sectional view taken along the line C-C. In addition, the same reference numerals as those in FIG. 10 are given to the same components.

According to the fourth embodiment of the invention, the two-dimensional array of the light emitting devices which are multiple two-dimensionally arranged single crystal compound semiconductor thin films and two Si (111) thin-film integrated devices for driving the light emitting devices are bonded and integrated on the same substrate. Accordingly, connection among the light emitting devices and the driving circuits can be established by thin-film wirings, and thus a compact two-dimensional light emitting array integrated with the driving circuits can be achieved.

Here, the multiple single crystal compound semiconductor thin films and the Si (111) thin-film integrated devices are bonded on the substrate in the following manner. The separated surfaces of the single crystal compound semiconductor thin films and the Si (111) thin-film integrated devices are in direct and close contact, bonded, and fixed on substrate 7001 or on the bonding layer provided on substrate 7001 by using the separated surfaces thereof as the bonding surfaces. That is to say, the separated surfaces of the single crystal compound semiconductor thin films and the Si (iii)) thin-film integrated devices are bonded on substrate 7001 or on the bonding layer provided on substrate 7001, by using the separated surfaces thereof as the bonding surfaces, by intermolecular force bonding or bonding using a strong binding such as covalent binding or the like.

Modification

Figure 14:
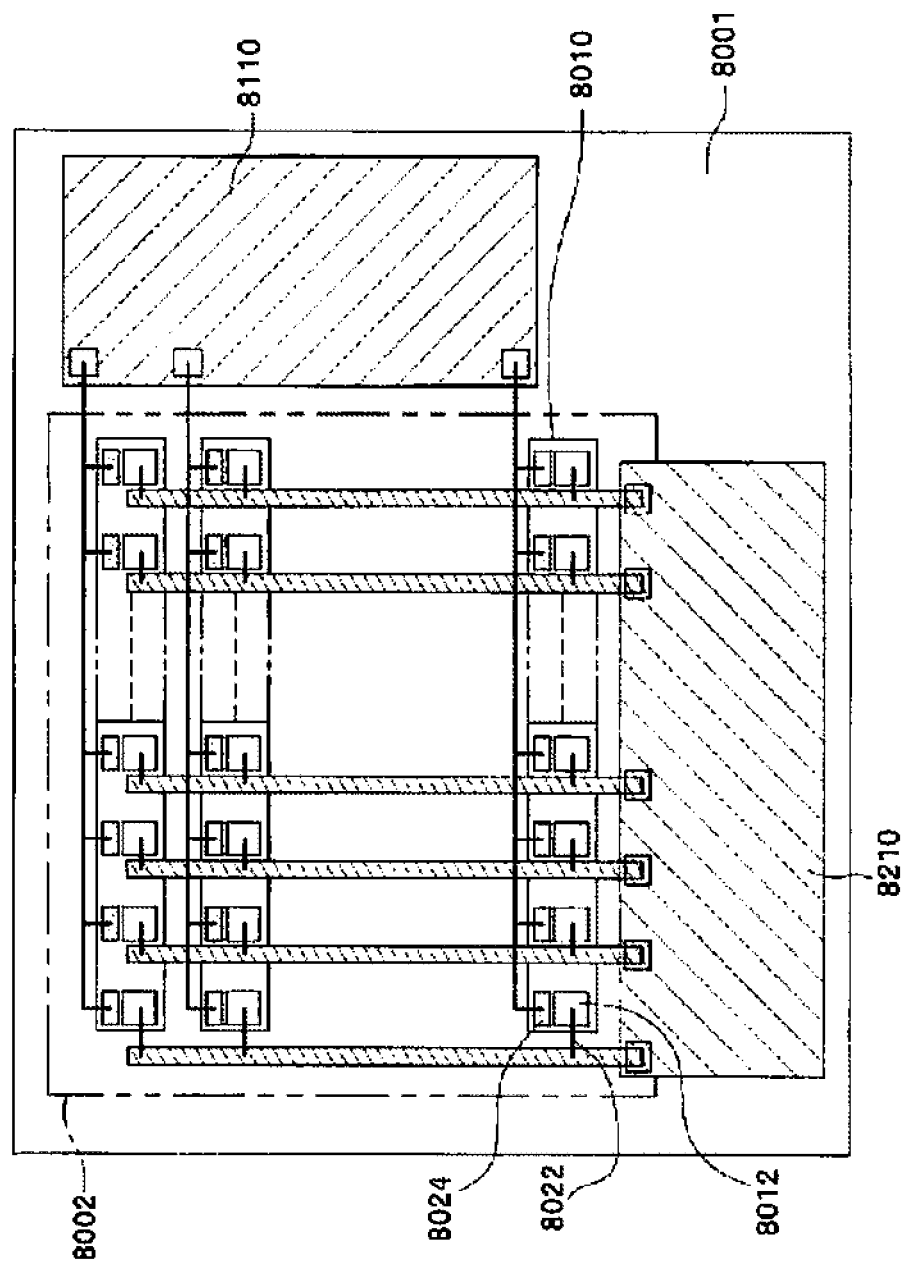
FIG. 14 is a plan view of a modification of the fourth embodiment.

A modification of the embodiment is described with reference to FIG. 14. In the fourth embodiment, the light emitting devices are 3-terminal light emitting devices each including a first p-n junction, a second p-n junction, and first to third electrodes. However, the modification shows a configuration of 2-terminal light emitting devices as single crystal compound semiconductor thin film 8010, each including a p-n junction, first electrode 8022 and second electrode 8024. The configuration can be such that first Si (111) thin-film integrated device 8110 and second Si (111) thin-film integrated device 8210 are bonded, both including a shift register circuit and an IC for controlling current, as a driving circuit for driving the light emitting devices.

Here, first Si (111) thin-film integrated device 8110 and second thin-film integrated device 8210 are bonded on the substrate in the following manner. Separated surfaces of first Si (111) thin-film integrated device 8110 and second Si (111) thin-film integrated device 8210 are in direct and close contact, bonded, and fixed on substrate 8001 or the bonding layer provided on substrate 8001, by using the separated surfaces thereof as the bonding surfaces. That is to say, in the configuration, first Si (111) thin-film integrated device 8110 and second Si (111) thin-film integrated device 8210 are bonded on substrate 8001 or on the bonding layer provided on substrate 8001 by using the separated surfaces thereof as the bonding surfaces by intermolecular force bonding or bonding using a strong binding such as covalent binding.

In addition, in the embodiment, although the description is given by taking the light emitting devices of the single crystal thin film as an example, light emitting devices using an organic material may be used instead of the light emitting devices of the single crystal thin film.

What is claimed is:

1. A semiconductor device comprising:
   a substrate having a surface;
   a light emitting element having an electrode forming surface and a bonding surface provided on an opposite side to the electrode forming surface, the bonding surface directly bonded to the surface of the substrate; and
   a Si (111) element having a first surface and a second surface opposed to the first surface, the Si (111) element including an integrated circuit configured to drive the light emitting element, wherein
   the second surface of the Si (111) element is directly bonded to the surface of the substrate;
   the light emitting element includes a first electrode, a second electrode and a third electrode,
   the second electrode is connected to the integrated circuit by a metal thin-film wiring,
   wherein the integrated circuit of the Si (111) element comprises a controller configured to control an electrical current flowing between the first electrode and the third electrode.

2. A semiconductor device according to claim 1, wherein the second surface of the Si (111) element is bonded to the surface of the substrate by intermolecular force.

3. A semiconductor device according to claim 1, wherein the surface of the substrate has a bonding layer, and the second surface of the Si (111) element is directly bonded to the bonding layer.

4. A semiconductor device according to claim 3, wherein the second surface of the Si (111) element is bonded to the bonding layer by intermolecular force.

5. A semiconductor device according to claim 1, wherein the bonding surface of the light emitting element is bonded to the surface of the substrate by intermolecular force.

6. A semiconductor device according to claim 1, wherein the surface of the substrate includes a bonding layer, and the bonding surface of the light emitting element is directly bonded to the bonding layer.

7. A semiconductor device according to claim 6, wherein the bonding surface of the light emitting element is bonded to the bonding layer by intermolecular force.

8. A semiconductor device according to claim 1, wherein the light emitting element is made of a compound semiconductor.

9. A semiconductor device according to claim 1, wherein the light emitting element includes at least a first PN junction and a second PN junction.

10. A semiconductor device according to claim 1, wherein the substrate is a metal substrate.

11. A semiconductor device according to claim 2, wherein a flatness of the second surface of the Si (111) element is equal to or less than 2 nm.

12. A semiconductor device according to claim 3, wherein the bonding layer is a metal layer, an AlN layer, or a diamond-like carbon layer.

13. A semiconductor device according to claim 6, wherein the bonding layer is a metal layer, an AlN layer, or a diamond-like carbon layer.

14. A semiconductor device according to claim 1, wherein the Si (111) element includes at least one of an antenna device, piezoelectric device on the first surface of the Si (111) element.

15. A semiconductor device according to claim 1, wherein the Si (111) element includes at least one of a solar cell device, a high-frequency device, an optical device, and a reflecting mirror.

* * * * *